(12) United States Patent
Usenko

(10) Patent No.: US 6,995,075 B1
(45) Date of Patent: Feb. 7, 2006

(54) PROCESS FOR FORMING A FRAGILE LAYER INSIDE OF A SINGLE CRYSTALLINE SUBSTRATE

(75) Inventor: Alexander Usenko, Murray Hill, NJ (US)

(73) Assignee: Silicon Wafer Technologies, Newark, NJ (US)

( * ) Notice: Subject to any disclaimer, the term of this patent is extended or adjusted under 35 U.S.C. 154(b) by 122 days.

(21) Appl. No.: 10/195,045

(22) Filed: Jul. 12, 2002

(51) Int. Cl.
*H01L 21/30* (2006.01)

(52) U.S. Cl. ............... 438/458; 438/459; 438/471; 438/526

(58) Field of Classification Search ............... 438/162, 438/407, 440, 475–479, 977, 120, 458, 459, 438/455–457, 526, 471–474, 798, 464
See application file for complete search history.

(56) References Cited

U.S. PATENT DOCUMENTS

| | | | | |
|---|---|---|---|---|
| 5,374,564 | A * | 12/1994 | Bruel ..................... | 438/455 |
| 5,759,904 | A * | 6/1998 | Dearnaley ................ | 438/528 |
| 5,877,070 | A * | 3/1999 | Goesele et al. ........... | 438/458 |
| 6,159,824 | A * | 12/2000 | Henley et al. ............ | 438/455 |
| 6,191,007 | B1 * | 2/2001 | Matsui et al. ............ | 438/459 |
| 6,352,909 | B1 | 3/2002 | Usenko | |
| 6,387,829 | B1 * | 5/2002 | Usenko et al. ........... | 438/120 |
| 6,548,382 | B1 * | 4/2003 | Henley et al. ............ | 438/526 |
| 6,808,967 | B1 * | 10/2004 | Aspar et al. ............. | 438/162 |

OTHER PUBLICATIONS

Lavrov et al. ,"Evolution of hydrogenplatelets in silicon determined by polarized Raman spectroscopy", Journal. Phys Rev Ltt., vol. 87, No. 18, pp. 185502/1-4.*

Lavrow et al. , Physics Rev. Letters , vol. 87, No. 18, pp. 185501/1-4).*

N. Sato, K. Sakaguchi, K. Yamagata, T. Atoji, Y. Fujiyama, J. Nakayama, T. Yonehara, "High-quality epitaxial layer transfer (ELTRAN) by bond and etch-back of porous Si", IEEE International SOI Conference, 1995, Tucson, AZ, USA, pp. 176-177.

C. Qian, B. Terreault, "Layer splitting by H-ion implantation in silicon: Lower limit on layer thickness?", Materials Res. Soc. Symp.—Proceedings, vol. 585, pp. 177-182, (2000).

A. Usenko, W.N. Carr, Bo Chen, Y. Chabal, "Alternative smart-cut-like process for ultra-thin SOI fabrication" Advanced Semiconductor Manufacturing 2002 IEEE/SEMI Conference and Workshop , Boston, MA, 2002 pp. 6-9.

(Continued)

*Primary Examiner*—Carl Whitehead, Jr.
*Assistant Examiner*—Yennhu B. Huynh
(74) *Attorney, Agent, or Firm*—DeMont & Breyer, LLC

(57) ABSTRACT

Process for forming a fragile layer inside of a single crystalline substrate near one of the substrate surfaces. The fragile layer contains hydrogen mostly in form of hydrogen platelets oriented in parallel to each other and to neighboring crystal surface. The fragile layer is preferably grown within a single crystalline silicon wafer to facilitate the detachment of an overlaying thin layer of single crystalline silicon from the initial wafer. The hydrogen layer is grown on a seed layer. The seed layer is preferably formed by ion implantation of inert gases at doses in $10^{15}$ cm$^{-2}$ range. The hydrogen layer is grown by plasma hydrogenation of the substrate. The hydrogenation process begins at substrate temperature not exceeding 250° C., and than continues at higher temperature not exceeding 400° C. The method can be used to fabricate silicon-on-insulator (SOI) wafers wherein a thin layer of single crystalline silicon is detached from a silicon substrate along the fragile layer and attached to a substrate with an insulator on top of that substrate.

19 Claims, 4 Drawing Sheets

OTHER PUBLICATIONS

F.A. Reboredo, S.T.Pantelides, "Hydrogen platelets in crystalline silicon—precursors for the smart cut", Diffusion and Defect Data Pt.B: Solid State Phenomena, v 69, 1999, p 83-92.

K. Henttinen, T. Suni, A. Nurmela, I. Suni, S. S. Lau, T. Höchbauer, M. Nastasi and V.-M. Airaksinen, "Cold ion-cutting of hydrogen implanted Si", Nuclear Instr. and Meth. in Phys. research B, vol. 190, May 2002, pp. 761-766.

N. H. Nickel, The Role of Hydrogen for Disordered Silicon, Mat. Res. Soc. Symp. Proc. vol. 715, Materials Research Society, 2002, pp. A1.5.1-A1.5.12.

G. Faraci, S. La Rosa, A. R. Pennisi, S. Mobilio, G. Tourillon, "Evidence for crystalline overpressurized Ar clusters in Al and Si", Phys. Rev. B, 1991, vol. 43, pp. 9962-9964.

G. Faraci, A. R. Pennisi, J. -L. Hazemann "XANES of high-pressure Kr clusters in Be and Si" Phys. Rev. B, vol. 56, pp. 12553-12559, 1997.

Hess, I.C. Kizilyalli, J.W. Lyding, "Giant isotope effect in hot electron degradation of metal oxide silicon devices", IEEE Transactions on Electron Devices, pp. 406-416 vol. 45, 1998.

A.Y. Usenko, W.N. Carr, B. Chen, "Crystal Fracture Induced By Decorating Of Post-Implantation Defects: Silicon Layer Delaminating", in: Proceedings of 14th International Conference on Ion Implantation Technology, Sep. 22-27, 2002, Taos, NM.

* cited by examiner

PROCESS FOR FORMING A FRAGILE LAYER INSIDE OF A SINGLE CRYSTALLINE SUBSTRATE

FIELD OF THE INVENTION

The present invention relates generally to crystalline layer transfer techniques. More particularly, the present invention relates to a fabrication method for silicon-on-insulator wafers.

BACKGROUND OF THE INVENTION

Silicon-on-insulator (SOI) wafer is a starting material for manufacturing semiconductor devices and integrated circuits. SOI wafers are the starting material that replaces bulk silicon wafers in high-speed, low power, radiation-hard, high-level integration, and others high-end areas of semiconductor chip manufacturing.

There are several methods that are currently in use for manufacturing of the SOI wafer:
(1) separation by implanted oxygen (SIMOX), described by Izumi et al. in 1978 (K. Izumi, M. Doken and H. Ariyoshi, Electron Letters 14, 1978, p. 593)
(2) bond-and-ethchback silicon-on-insulator (BESOI) described by Lasky in 1986 (J. B. Lasky, "Wafer bonding for silicon-on-insulator technologies" Appl. Phys. Lett. Vol. 48, p. 76, 1986)
(3) layer transfer (Smart-Cut) described by Bruel in 1992 (U.S. Pat. No. 5,374,564).

The most advanced method is the layer transfer. The layer transfer method consists from the following steps as it schematically shown on FIG. 1:
(1) providing a donor wafer 101
(2) forming a fragile plane layer 102 for separation inside of the donor wafer 101 thus defining a cap layer 111
(3) providing a handle wafer 103; the handle wafer 103 typically comprises a silicon wafer with an insulator (i.e., silicon dioxide) layer 104; alternatively, the donor wafer is oxidized and thus covered with the layer 104, or both wafer 101 and wafer 103 have the insulator layer 104 on their surfaces
(3) initial attaching of said donor wafer 101 to said handle wafer 103 along an interface 105 thus making a temporary wafer assembly 106
(4) separation of said assembly 106 along said fragile plane 102; this step might include a substep of additional fragilization of said plane 102. An SOI wafer 107 and a leftover wafer 108 are formed upon the separation step. A layer 111 can be now considered as a layer transferred from the wafer 101 to the wafer 103, thus giving a name to the method. Said SOI wafer 107 consists from a handle 109, buried oxide layer 104, cap layer 111 with working surface 112
(5) finalizing of the SOI wafer 107 that includes strengthening of initial attachment along the interface 105, perfecting of crystalline quality of the cap layer 111, smoothing of said working surface 112. The finalizing step might also include shaping of SOI wafer edges, thinning of the cap layer 111, surface polishing, and other optional operations.

Several versions of the layer transfer method are known in the prior art. The versions comprises different ways to form the fragile layer 102, different ways of separation of the assembly 106, etc. For example, separation can be thermally induced (Bruel, U.S. Pat. No. 5,374,564), water jet induced (K. Sakaguchi, K. Yanagita, H. Kurisu, H. Suzuki, K. Ohmi, T. Yonehara, ELTRAN by water-jet splitting in stress-controlled porous Si, IEEE International SOI Conference, Oct. 4–Oct. 7, 1999, Rohnert Park, Calif., USA, p. 110–111), bend induced (Usenko, U.S. Pat. No. 6,352,909), and via blade insertion (K. Henttinen, T. Suni, A. Nurmela, I. Suni, S. S. Lau, T. Höchbauer, M. Nastasi and V. -M. Airaksinen, "Cold ion-cutting of hydrogen implanted Si", Nuclear Instr. and Meth. in Phys. Research B, Vol. 190, May 2002, Pages 761–766.).

However, separation techniques and other late process stages are dependent on the earlier more fundamental stage of forming of the fragile plane layer 102. The fragilization process determines the thickness of the layer to be transferred, and the quality of that layer. The following processes for forming a single crystalline substrate with a fragile layer inside the substrate are known in the prior art:
(1) use of a buried porous silicon layer as a fragile layer (T. Yonehara, "ELTRAN SOI-Epi Wafer and SCLIPS by Epitaxial Layer Transfer from Porous Si," $2^{nd}$ Int. Conf. Porous Semiconductors Science and Technology, p. 14, 2000) and its modifications where the fragile layer comprises porous silicon
(2) fragilization by ion implanted gaseous species (Smart-Cut™, described by Bruel in U.S. Pat. No. 5,374,564) and its modifications
(3) fragilization by hydrogen trapping onto buried defect layer (Usenko, U.S. Pat. No. 6,352,909, Matsui U.S. Pat. No. 6,191,007, see $21^{st}$ preferred embodiment in the Matsui's patent).

In the ELTRAN (N. Sato, K. Sakaguchi, K. Yamagata, T. Atoji, Y. Fujiyama, J. Nakayama, T. Yonehara, "High-quality epitaxial layer transfer (ELTRAN) by bond and etch-back of porous Si", IEEE International SOI Conference, 1995, Tucson, Ariz., USA, pp. 176–177), an epitaxial layer is grown on top of the preformed porous silicon layer. The growing epilayer tends to seal the pores thus making the layer transfer possible. After some thickness achieved, the pores disappear, and quality of the further growing epitaxial layer gradually increases with thickness. A continuous single crystalline layer now covers a porous (i.e., fragile) layer. This puts a limit on a minimum thickness of the transferred layer. A typical (inherent) thickness of a transferred layer exceeds micron. For mainstream CMOS SOI manufacturing this thickness is too big. The transferred layer is further thinned back to about 0.2 micron thus also removing the worst quality part of the silicon cap, and leaving the best quality part of the silicon cap. Further thinning is limited because it increases thickness nonuniformity of the cap layer. Therefore, with the porous silicon based SOI processes it is difficult to form an SOI wafer with a thin cap layer. ELTRAN therefore is herd to use for next generations of integrated circuits that require starting SOI with thinner layers of 0.1 micron and less.

In the Smart-Cut™, the fragile layer is formed by hydrogen ion implantation at high dose ($\sim 5 \times 10^{16}$ cm$^{-2}$) and low dose rate (less than $10^{13}$ cm$^{-2}$s$^{-1}$). The depth to which hydrogen ions penetrate into silicon determines an inherent thickness of the transferred layer. Hydrogen ions have smaller atomic mass than any other ions and therefore penetrate deeper than other ions. For typical ion implantation energies 30–100 keV the depth will be 0.3 to 1 micrometer. Implantation at lower ion energies for the Smart-Cut raises several problems. When the high-energy ion reaches a target (i.e., silicon), it dissipates its energy mostly because of interaction with the electronic subsystem of the silicon crystal. The energy of the penetrating ion gradually decreases as its energy is transferred mostly to electrons in the target material. When the ion energy drops to about 10 keV, the ion produces mostly atomic displacements, and it quickly stops, resulting in so-called end-of-the-range defects (i.e., silicon atoms displaced from their regular lattice positions). The change of the energy dissipation mechanism from electron to atomic displacements has an important consequence, whereby the implanted crystal contains a layer on its top that is very lightly damaged, a buried layer around projection range depth of the implanted ions that is heavily damaged, and an almost undamaged crystal bulk underneath of the projection range depth. In the Smart-cut, the use of the high-energy hydrogen ions allows to form a buried damaged and hydrogen rich layer under a layer of crystalline silicon that is very lightly damaged. Ion implantation at low energy (~10 keV and less) makes effective atomic displacements right from point where ion reaches the target (i.e., from surface). It results in a damaged layer that is not buried under surface but it is located right on the surface. The damaged surface has an increased roughness and it cannot be bonded to another (handle) substrate. Therefore attempts to use low energy hydrogen implantation in Smart-cut resulted in layer transfer faults (C. Qian, B. Terreault, "Layer splitting by H-ion implantation in silicon: Lower limit on layer thickness?", Materials Res. Soc. Symp.—Proceedings, Vol. 585, pp. 177–182, (2000). Finally, the hydrogen implantation based fragilization process is not suitable for thin cap SOI wafer manufacturing.

The most advanced thin layer transfer process known from the prior art is based on diffusion of hydrogen into silicon and collecting of the hydrogen at preformed buried layer of defects. This process can be used to fabricate SOI with extremely thin cap layers down to 30 nm in thickness or less (A. Usenko, W. N. Carr, Bo Chen, Y. Chabal, "Alternative smart-cut-like process for ultra-thin SOI fabrication" Advanced Semiconductor Manufacturing 2002 IEEE/SEMI Conference and Workshop, Boston, Mass., 2002 pp. 6–9). Hydrogen is delivered to the buried layer with either electrolytic means (Usenko, U.S. Pat. No. 6,352,909), or from hydrogen plasma (Usenko, U.S. Pat. No. 6,352,909, Matsui U.S. Pat. No. 6,191,007, see $21^{st}$ preferred embodiment). The buried defect layer serves as an infinite capacity trap for the hydrogen.

However, the hydrogenation process takes considerably long time (~1 hour in the methods known from the prior art). This increases the cost of manufacturing. The art would therefore benefit from an improved method for SOI fabrication. Such a method would incorporate steps of fast hydrogenation to avoid the drawbacks of the prior art.

SUMMARY OF THE INVENTION

The method in accordance with the present invention provides a fabrication method for SOI wafers that avoids the drawbacks of the prior art. In particular, the method includes a step of forming of a fragile layer by fast hydrogenation of a trap layer. The fast hydrogenation is achieved by two-step processing with low processing temperature at the first substep, and higher processing temperature at the second substep. The hydrogenation process goes through phases of the hydrogen platelet nucleation and the platelet growth. The hydrogen platelets are two-dimensional species obtained if hydrogen atoms are inserted between two neighboring low-index lattice planes. Hydrogen atoms terminate host atoms in both lattice planes around the platelet. A smallest platelet nuclei is $VH_4$, i.e., a vacancy in a crystal lattice surrounded with four hydrogen atoms. The hydrogen platelets nucleate at temperatures not exceeding 250° C. The first step of the hydrogenation serves for the platelet nucleation from vacancy clusters; therefore it is prepared at the temperature of 250° C. or below. The platelet nuclei are the platelets with a small size, starting from the $VH_4$ configuration. The platelet nuclei serve as infinite capacity traps for incoming hydrogen. By trapping the incoming hydrogen the platelets grow in size. Due to a strain distribution in the trap layer, the platelets preferentially grow along the plane of the trap layer, if the trap layer is parallel either <100> or <111> crystallographic plane. Once nucleated, the platelets can be further grown at temperatures exceeding 250° C. The platelet growth rate increases with temperature. Therefore the platelet growth step is performed at temperatures in a range of 250 to 400° C. Hydrogenation at temperatures that are higher than 400° C. results in transformation of the platelets into hydrogen bubbles having high internal pressure. The pressurized bubbles break overlaying silicon film resulting in blistered surface of silicon which is unacceptable for bonding to a handle wafer. Therefore the hydrogenation is performed at temperature not exceeding 400° C.

The SOI wafer is fabricated by:

(1) providing a donor semiconductor substrate;

(2) forming a buried trap layer for hydrogen in said substrate;

(3) nucleating of hydrogen platelets from said buried traps by hydrogenation at temperatures not exceeding 250° C.;

(4) growing of said platelets by hydrogenation at temperatures in a range 250° C. to 400° C. thus forming a buried fragile layer inside of said donor wafer;

(5) providing a handle semiconductor substrate having an dielectric layer on its top surface;

(6) activating of surfaces of said donor and handle substrates;

(7) forming a temporary wafer assembly by an initial contacting of the activated surfaces of said donor and handle substrates;

(8) separating said wafer assembly into two wafers by cleaving the assembly at the said fragile layer.

Steps (1) to (4) complete a process of forming a fragile layer inside of a single crystalline substrate, and steps (5) to (8) complete a SOI wafer process with layer transfer.

In a first preferred embodiment of the inventive process, the buried trap layer is formed by conventional ion implantation. The ion implantation step is used here not for introducing of impurities, but for making displacements of atoms of the host lattice from their regular positions in the lattice. Therefore the ions used for the implantation are advantageously either the ions of impurities, that do not have an electrical activity in the silicon crystal (for example, oxygen), or ions of the same element as the crystal substrate (i.e., silicon). The displaced atoms of the silicon lattice forms a layer that is highly enriched with vacancy clusters at a depth that is less than a projected range of the implanted ions, and a layer that is highly enriched with interstitial clusters at a depth that is greater than the projected range of the implanted ions. The vacancy clusters serve as nuclei of the hydrogen platelets during the first step of the hydrogenation. Therefore the trap layer for hydrogen appears at a depth that is less than a projection depth of the implanted ions. Typically, the depth is in between ½ to ⅘ of the projection range, depending on mass ratio of the implanted ions and lattice atoms. For example, for the silicon implanted into silicon case at 100 keV, the depth where the vacancy clusters are created in maximum concentration is about 0.3 micrometers. The thin film above the fragile layer can be delaminated from the parent substrate and attached to another (handle) substrate.

In a second preferred embodiment of the inventive process, the buried trap layer for hydrogen is formed by ion implantation of impurities that do not chemically interact with silicon, and are gaseous. Ions of noble gases are preferably used, chosen from a group of helium, neon, argon, xenon, or krypton. The ion implantation is performed at temperatures 300 to 700° C. Alternatively, the implantation is performed at room temperature, and the silicon substrates are than annealed in a non-oxidizing atmosphere at temperatures 300 to 700° C. The implanted species form a buried layer of small, high-pressure gaseous bubbles. Those bubbles serve as hydrogen platelet nuclei during subsequent hydrogenation. Therefore the hydrogenation process in the second preferred embodiment is begun from the platelet growth stage, and it is performed at temperatures in a range of 250 to 400° C.

DETAILED DESCRIPTION OF THE FIRST PREFERRED EMBODIMENT

This invention reduces manufacturing cost in fabrication of silicon-on-insulator (SOI) wafers with a thin cap layer.

Figure 2:
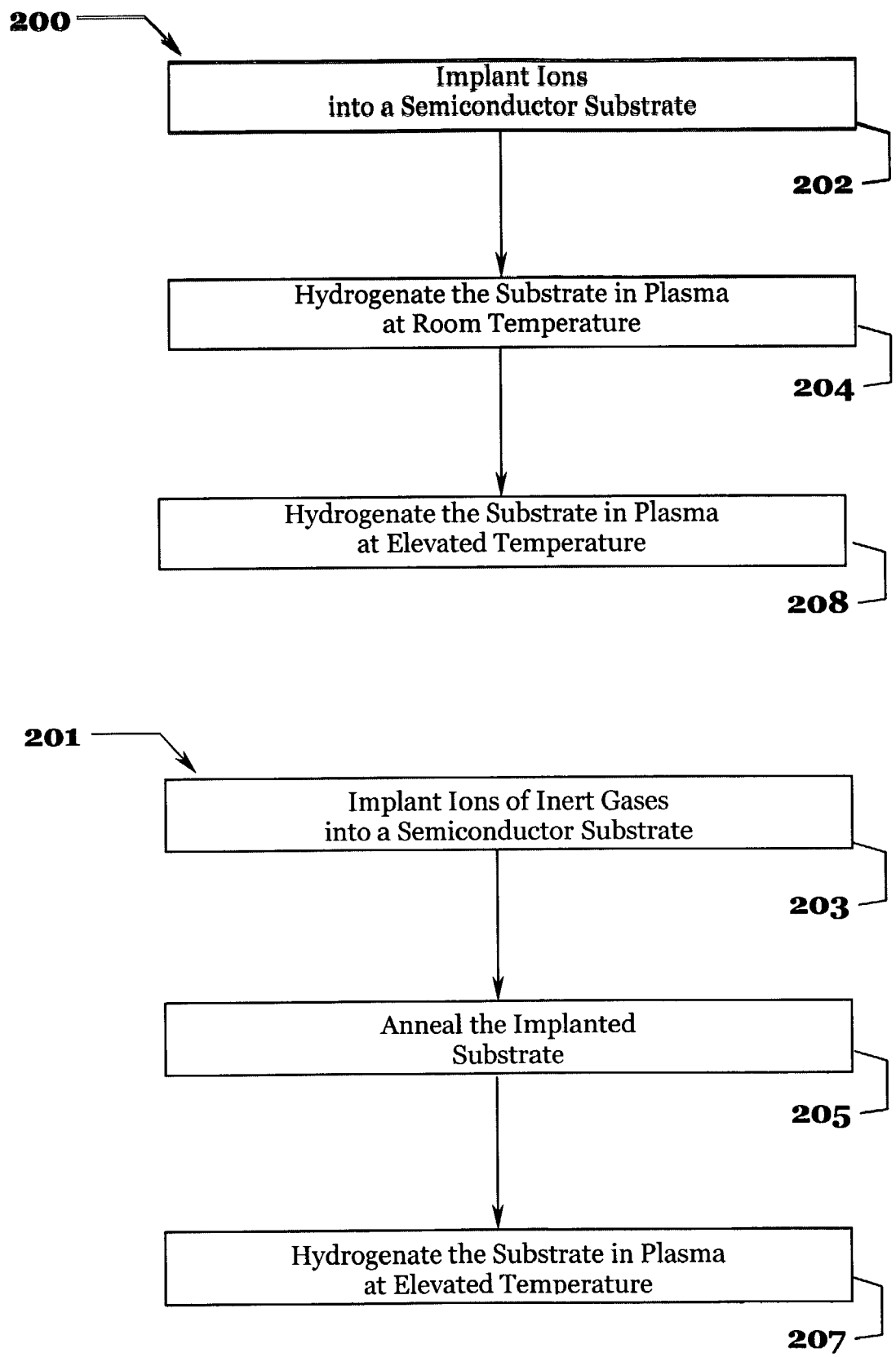
FIG. 2 depicts flow diagrams of a process for forming of a fragile layer in accordance with the present invention due to 1$^{st}$ and 2$^{nd}$ preferred embodiments.
Figure 3:
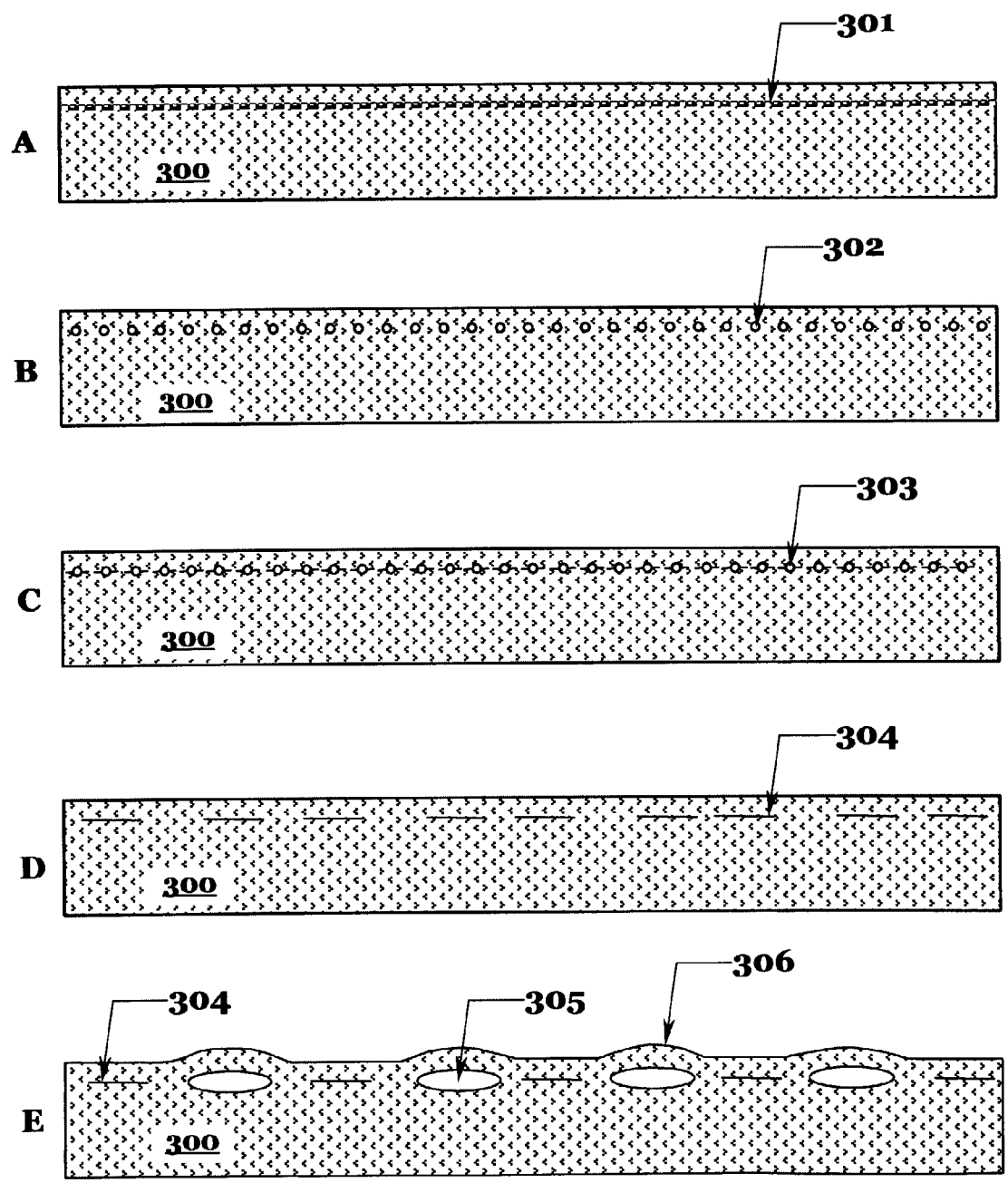
FIG. 3 illustrate evolution of a buried layer inside of the single crystalline substrate during the layer fragilization, and a relief that develops on the wafer surface if a temperature during a final step of hydrogenation performed exceeds 400° C.

The embodiment, which will now be described, shows a method for making a fragile layer inside of the single crystalline silicon substrate. A diagram 200 on FIG. 2 schematically shows the process sequence. FIG. 3 shows evolution of a layer inside of the wafer 300 during steps of fragilization process 200 FIG. 2. The substrate with the fragile layer inside can be further used in a course of layer transfer FIG. 1. A product of the layer transfer process is a thin cap SOI wafer 107 FIG. 1, and the relevant SOI fabrication process is also described here, and schematically shown on FIG. 1.

Figure 1:
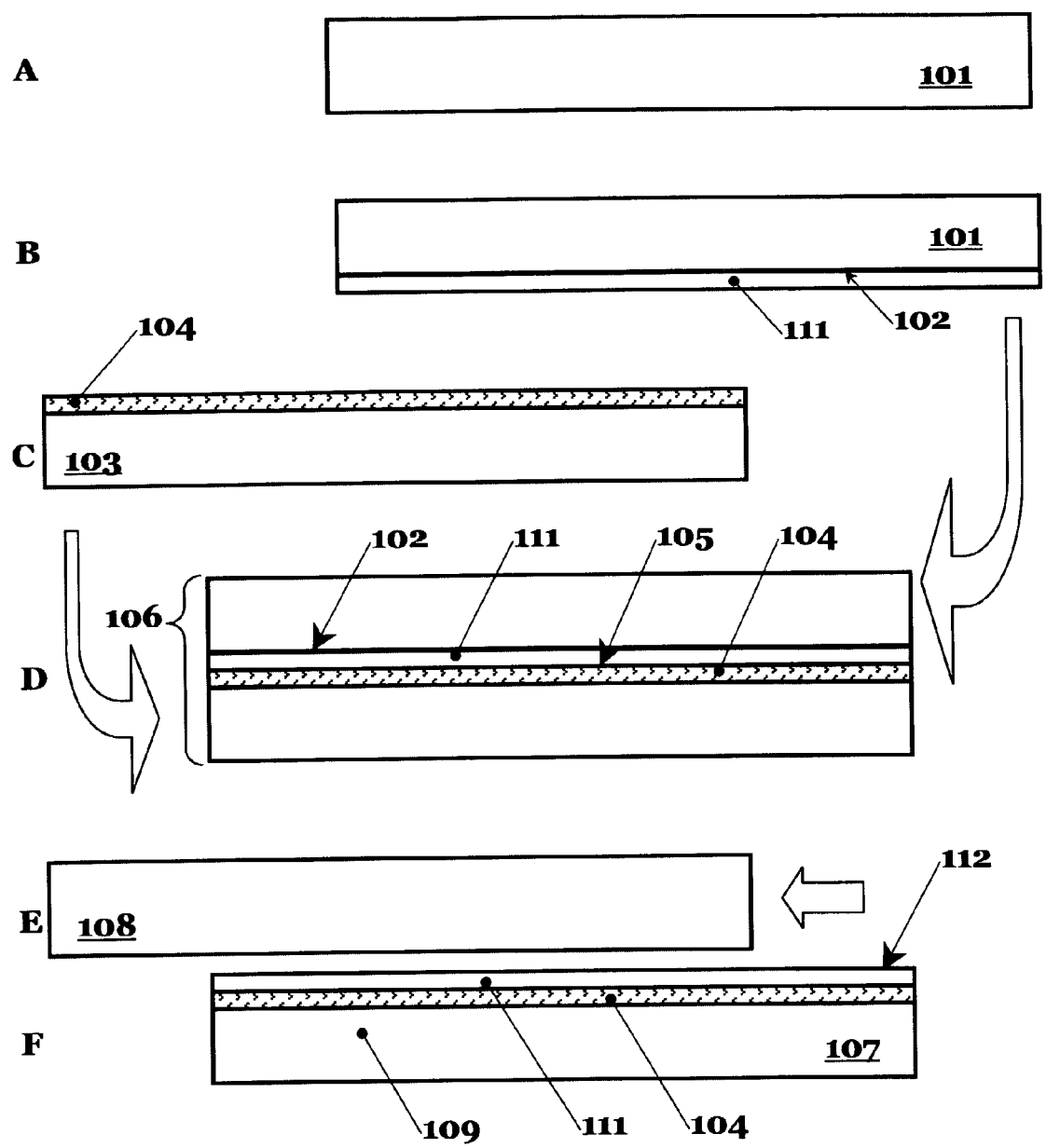
FIG. 1 depicts stages in the processes for silicon-on-insulator (SOI) wafer fabrication with layer transfer along a fragile layer.

Standard silicon wafers 101 FIG. 1 of 150 mm diameter, 0.625 mm thickness, <100> crystallographic surface orientation, made from Czochralski pulled ingots representative initial donor wafers. Donor wafers can be phosphorus-doped with n-type conductivity, or boron doped with had p-type conductivity. Resistivity of can vary over the range from very large to 0.1 Ohm·cm and less.

The donor wafers are implanted with silicon ions at dose of $2 \times 10^{15}$ cm$^{-2}$, an energy of 50 keV, and dose rate about $10^{14}$ ions·cm$^{-2}$·S$^{-1}$, step 202 as shown on FIG. 2 The wafers are not specially heated or cooled during the implantation.

The implanted wafers are placed into a single-wafer plasma reactor, step 204 in FIG. 2. The upper and bottom electrodes of the reactor are connected to a 13.56 MHz radio frequency generator supplying 300 W radio frequency power. The bottom electrode includes a built-in resistive heater and a thermocouple for temperature control. The heater and the thermocouple are connected to a controller and power source to keep a chosen wafer temperature stable during the plasma processing. A hydrogen gas flow of 10 to 200 sccm is put into the plasma reactor resulting in pressure in the plasma chamber at a desired value in a range of 0.1 to 10 mTorr. Under radio frequency excitation the hydrogen gas in the chamber ionizes and forms hydrogen plasma containing ionized molecular hydrogen in $H_2^+$, and $H_2^{++}$ forms, ionized monatomic atomic hydrogen in form $H^+$, and also non-ionized hydrogen in both, molecular and monatomic forms $H_2^\circ$ and $H^\circ$. The monatomic hydrogen has a much higher desired diffusivity in the crystalline silicon than the molecular hydrogen. The main reason for radio frequency excitation of the hydrogen gas into plasma form is to increase concentration of the monatomic hydrogen. The wafers are processed in the hydrogen plasma for 20 minutes at wafer temperature 200° C.

After the initial step of hydrogenation at 200° C. 204 on FIG. 2, the temperature of the wafers is increased to 350° C. using the heater in the bottom electrode and temperature controller, and the hydrogenation continues approximately 10 minutes, step 208 on FIG. 2. This process step completes the process of forming of the fragile layer inside of crystalline substrate, FIG. 1B, and FIG. 3D.

As it was mentioned above, a smallest platelet nuclei is $VH_4$, i.e., a vacancy in a crystal lattice surrounded with four hydrogen atoms, that determined for the first time by Reboredo and Pantelides (F. A. Reboredo, S. T. Pantelides, "Hydrogen platelets in crystalline silicon—precursors for the smart cut", Diffusion and Defect Data Pt.B: Solid State Phenomena, v 69, 1999, p 83–92). The hydrogen platelets nucleate temperatures not exceeding 250° C., as it was determined for the first time by Nickel and Johnson.

During the first step of the hydrogenation nuclei of the hydrogen platelets are formed from vacancy-containing defects. The vacancy-containing defects are introduced into the wafer during silicon-into-silicon implantation and are mostly confined into a layer at a depth between half range and ⅘ of the range of the implanted ions. More precise determination of a depth of the maximum vacancy cluster-containing layer can be calculated using techniques known in previous art, for example, using a computer simulation program called SRIM that was developed by Ziegler, http://www.SRIM.org. One skilled in the art can calculate a depth of maximum, distribution, concentration, and other details of the vacancy clusters for given pair of implanted ions and target lattice, energy, and dose of the ions using, for example, using techniques described in the Handbook of Ion Implantation Technology, edited by J. F. Ziegler, Amsterdam, North-Holland, 1992. The depth of the maximum density of the vacancy cluster layers is important because this plane is the plane of cleavage when the fragile layer is created. This depth further determines the thickness of the layer to be delaminated from the host substrate and transferred to a handle substrate.

The buried, vacancy cluster-enriched layer for the purpose of hydrogen trapping can be also created using implantation of ions different from silicon. Ions that do not segregates in silicon at the temperature of implantation, and that do not form chemical compounds in silicon can also be used for this purpose. Particularly, germanium ions can be used. Germanium has a larger ion mass, when implanted will produce a trap closer to the surface compared with lighter ions. Germanium can thus be used to fabricate SOI wafers with a thinner cap.

Further description of the preferred embodiment relates to use of the silicon wafer with the fragile layer inside FIG. 1B, FIG. 3D in a layer transfer process FIG. 1 resulting in fabrication of SOI wafer 107 FIG. 1. The hydrogenated donor wafer FIG. 1B and an oxidized handle wafer FIG. 1C are subjected to surface activation that renders the surfaces of both wafers hydrophilic. A simplest technique of the surface activation is to soak of the wafers in a standard RCA clean bath, followed by a drying using typically a spin dry. However, for faultless layer transfer process, a surface activation is preferably performed in plasma, for example, in methanol plasma, as described in U.S. Pat. No. 6,180,496 awarded to Farrens.

The plasma activation enables a stronger initial bonding force, and better final bonding than the wet activation for several reasons. The wafer surfaces get covered with an adsorbed species during the activation. For the hydrophilic bonding the surfaces are covered with hydroxyl groups. The surfaces can be covered with less than one monolayer, with one monolayer, or with several monolayers of the adsorbed species. With wet activation the surfaces are usually covered with several monolayers, while the plasma activation allows better control over the amount of the absorbed species. 1 monolayer coverage is possible to obtain with the plasma activation.

Upon the wafer contacting, the absorbed species make bridges between the two wafer surfaces. The hydroxyl groups absorbed on surfaces form bridges between the surfaces. Bigger amount of absorbed species allow longer bridges, and rougher surfaces (with several atomic layer roughness) can be bonded. However, after the surface contacting, the former adsorbed species get locked up between to crystal substrates and they have to be diffused away to complete the bonding of the substrates. Complete bonding means that hydrogen-containing species are diffused away from the bond interface, and all hydrogen bonds are replaced with covalent bonds between silicon atoms. Complete bonding requires heating to 900° C. and it is performed after the wafer assembly cleavage, FIG. 1F. Some hydroxyl groups form water molecules, and it is difficult to remove these molecules from the interface. Excessive water forms bubbles causing voids on the bonding interface. Therefore, an excessive amount of the adsorbed species is undesirable. One monolayer is about an optimum value for the wafer bonding. This condition can be achieved with the plasma activation. A disadvantage of wet activation is that after spin drying they are exposed to air, and adsorb nitrogen from air onto their surfaces. Adsorbed nitrogen further prevents covalent bonding between two contacted silicon surfaces. Complete removal of nitrogen requires 1100° C. temperature for diffusion away from the interface. This temperature is too high for processing of sub-hundred nanometer-thick SOI wafers. Plasma activation allows contacting of the substrates without exposing them to air. The substrates are contacted in the plasma chamber. This method of the substrate bonding also excludes particle contamination from air, thus increasing the process yield. Carefully controlled surface activation is especially important for bigger size wafers (i.e., 300 millimeter diameter wafers). The reason is that the free energy gain (lowering of system free energy) obtained upon contacting of the activated surfaces mostly goes into elastic bending of the wafers to conform a pair of non-ideal surfaces and thus close gaps between the surfaces. The bigger wafers are usually also thicker, so the elastic bending requires more energy.

One skilled in the art can choose from the above and other surface activation technique from techniques described in a previous art. See for example, Semiconductor Wafer Bonding: Science and Technology by Q. Y. Tong, U. Gosele, Electrochemical Society, Pennington, N.J., 1998.

The activated wafers are further aligned and brought together as in FIG. 1D by their working surfaces, forming a wafer assembly 106 as described in previous art, for example, U.S. Pat. No. 5,374,564 awarded to Bruel. In-situ wafer contacting in a plasma chamber immediately after the plasma surface activation without exposing the surfaces to air is described, for example, in the Farrens patent is, however, preferable, based on the explanation in the paragraph above.

The next step is creating an SOI wafer from wafer assembly 106 is the cleavage process implemented by heating of the wafer assembly to 550° C. as described in the Bruel patent. Alternatively, cleavage can be performed with ultrasound activation (Usenko and Carr, U.S. Pat. No. 6,387, 829), or by applying a mechanical force (K. Henttinen, T. Suni, A. Nurmela, I. Suni, S. S. Lau, T. Höchbauer, M. Nastasi and V.-M. Airaksinen, "Cold ion-cutting of hydrogen implanted Si", Nuclear Instr. and Meth. in Phys. Research B, Vol. 190, May 2002, Pages 761–766).

After cleavage, the newly created SOI wafer 107 goes for completing of bonding (i.e., SOI wafers are annealed at 900 to 1100° C.) and than for optional finishing operations, as it is described in a prior art, for example, in the Bruel's patent cited above. However, for a thin cap SOI, an anneal temperature is preferably chosen in the 900° C. range in hydrogen atmosphere. Annealing in hydrogen serves to smooth the as-cleaved surface. Chemical-mechanical polishing that is primarily used in prior art for this purpose is no longer useful, because a thickness uniformity of sub-hundred nanometer thick SOI caps severely degrades by the chemical mechanical polishing.

Fragile layer formation and subsequent SOI fabrication can be performed using the donor wafer 101 with different conductivity type, different resistivities, different oxygen content. The fragile layer formation does not relate to properties of silicon as a semiconductor, but mostly relates to properties of silicon as a crystal. Therefore the fragilization process is not very sensitive to the impurity content of silicon. The as-implanted layer 301 FIG. 3A has compensated type of conductivity because of high concentration of the post-implantation defects (i.e., vacancy containing complexes). The post-implantation defects have mostly deep levels in silicon forbidden zone, Fermi level in the implanted silicon is close to midgap, and does not depend on initial (doping-controlled) conductivity. It was found by Nickel and Johnson (N. H. Nickel, The Role of Hydrogen for Disordered Silicon, Mat. Res. Soc. Symp. Proc. Vol. 715, Materials Research Society, 2002, pp. A1.5.1–A1.5.12) that the hydrogen platelets nucleate preferentially where the Fermi level is close to the midgap. One can anticipate that hydrogen diffused into the silicon crystal will not collect there, because it has an extremely low solubility in the silicon, and will diffuse into the silicon only to solubility limited concentration (about $10^{16}$ cm$^{-2}$). However, Nickel and Johnson performed plasma hydrogenation of standard silicon wafers in 1987 (see reference above), and they found hydrogen platelets inside the crystalline silicon as a result of the plasma hydrogenation. They found the platelets only in the layer close to the crystal surfaces. They suggested that hydrogen was contained in the platelets in $H_2$ (i.e., molecular) form. They point out that in n-type silicon the diffused-in hydrogen is mostly in negatively charged form $H^-$, while in the p-type silicon hydrogen is mostly in a positively charged form $H^+$, and in areas where Fermi level in silicon is near the midgap hydrogen presents in all three possible forms $H^+$, $H^\circ$, and $H^-$. Nickel and Johnson state that molecular hydrogen should be present prior to the formation of platelets. They state that the hydrogen molecule formation is suppressed, because $H^+$ species repel each other as species having the same electrical charge. Hydrogen species in $H^-$ form also repel each other for the same reason. Niclel and Johnson further conclude, that the platelets are observed in near surface regions because that regions are the only regions in the doped crystal, where energy zones are bent creating a Fermi level near midgap. In the present teaching, the platelet nucleation and growth can also be explained by the Nickel and Johnson's model. However, in the present patent platelets are formed not near the surface, but in the buried trap layer, because of the trap-forming step occurs prior to hydrogenation.

Implantation damages that appear in the silicon wafer during trap layer formation might have an adverse effect on the quality of a cap layer in the final SOI wafer. However, no any adverse effect are found in SOI wafers fabricated due to present teaching. The main reason is, that in the stage FIG. 1F of SOI wafer fabrication, wafers are annealed at a relatively high temperature (900° C.) and most post-implantation defects anneal out. Increasing of the amount of the post-implantation defects with increased implantation dose at some has a major effect on the layer transferring. If the implantation is performed at conditions when not only the buried layer in the implanted wafer amorphizes, but also the wafer surface amorphizes, then the layer transfer process fails. For example, in the case of silicon-into-silicon implantation at 100 keV at room temperature, a dose of approximately $5 \times 10^{15}$ cm$^{-2}$ and higher results in a failing of the layer transfer. If just few monolayers of crystalline silicon cover a buried amorphized layer, the layer can be successfully transferred, and the quality of the cap silicon in SOI will be comparable to the case of layer transfer with a fragile layer built on an implanted layer with an implantation dose lower, than a minimum dose for a buried layer amorphization. This can be explained by the following. Immediately after the cleavage step in the SOI process, an amorphous silicon layer covers a crystalline silicon layer. Upon heating, the amorphous silicon layer looses hydrogen. This process completes at about 550° C. Further annealing results in an epitatial regrowth of the top amorphous silicon layer on an underlying silicon single crystalline layer as on a seed. This process goes at 600° C. At temperatures over 600° C., the cap layer has a semiconductor device quality. Measurements of carrier mobilities shows up to 1000 cm$^2$/V·s for electrons, and up to 400 cm$^2$/V·s for holes in lightly doped transferred layers. However, annealing at 900° C. increases a quality of the cap layer.

DETAILED DESCRIPTION OF THE SECOND PREFERRED EMBODIMENT

This preferred embodiment describes a process of fast hydrogenation where the hydrogen platelets are nucleated by evolution of an implant under annealing. A diagram 201 on FIG. 2 schematically shows the process sequence. The platelet nuclei are than grown under plasma hydrogenation. This is different from the first preferred embodiment where both steps—platelet nucleation and platelet growth where done by plasma hydrogenation. The resulting wafer with a fragile layer inside can be used for the SOI wafer fabrication. That part is performed the same way as it is described in the first preferred embodiment, and therefore is not repeated here.

An initial wafer is chosen the same way as described in the first preferred embodiment.

The wafer is implanted with argon ions at dose of $10^{15}$ cm$^{-2}$, energy 50 keV, and dose rate about $10^{14}$ ions·cm$^{-2}$·S$^{-1}$, step 203 on FIG. 2 The wafers are not specially heated or cooled during the implantation.

There are two types of behavior of ion-implanted species in single crystalline targets:

(1) an implanted specie decelerates in the crystal, and makes a displacement cascade at the end of its trek. As soon as its energy drops below an energy required for displacement of an atom of host substrate from its regular lattice position, the specie stops and stays in an interstitial position. An energy needed to move the stopped specie is high (several eV), and therefore this position is stable at room temperature. The implanted species form a gauss-like depth distribution in the target with a maximum at a projected range of the implanted specie. The stopped specie is neighbored with either the host lattice atoms or with vacancies in the host lattice. At room temperature, no redistribution happen with the implanted species after they stop.

(2) Implanted specie decelerates in the crystal, makes a displacement cascade at the end of its trek, but does not stop after loosing the excessive energy. A position where the specie ends its trek is not stable at room temperature. The specie continues to move until it finds a position that is stable at room temperature (i.e., get trapped). Often, the specie drifts back toward the surface in a mechanically strained field of the as-implanted lattice. The strain drives the specie to a plane of maximum of vacancies, so-called half-range plane. At that plane the specie joins a cluster made of the same species (previously implanted). The species of this type are found in as-implanted targets in form of clusters.

Typical examples of the implants type (1) are boron, phosphorus, arsenic, antimony, silicon, and typical implants type (2) are hydrogen, helium, neon, argon, krypton, xenon. The implants type (1) can be used in a fragilization process due to the first preferred embodiment of the present invention, and cannot be used in a fragilization process due to the second preferred embodiment, while the implants type (2) can be used in the $2^{nd}$ preferred embodiment and cannot be used in the $1^{st}$ preferred embodiment.

The implants type (1) have a high solubility limit in silicon, diffuse by vacancy mechanism, and does not segregates, while the type (2) implants has low solubility limit, diffuse by interstitial mechanism, and they segregates. There are also implants that do not fall in either type (1) or type (2); those implants are not recommended for the fragilization process due to the present invention. Typical examples of these implants are oxygen, carbon, and fluorine. These implants either form stable chemical compounds with silicon or they outdiffuse from silicon at relatively low temperatures (~300° C.).

Now we consider in more details evolution of implants type (2) after they decelerate in the target lattice. This will allow one skilled in the art to choose properly the specie to implant, its dose, and energy to obtain a final SOI wafer with desired thickness of the cap and with high layer transfer yield.

After the type (2) implant specie thermalizes, it drifts in vertical direction and diffuses in horizontal direction, thus collecting into specie clusters at the half range depth. For example, the implanted argon collects into clusters of about 200 atoms each, and the clusters are organized into the argon lattice, as it was determined for the first time by Faraci et al.

in 1991 (G. Faraci, S. La Rosa, A. R. Pennisi, S. Mobilio, G. Tourillon, "Evidence for crystalline overpressurized Ar clusters in Al and Si", Phys. Rev. B, 1991, Vol. 43, pp. 9962–9964).

In free form, argon is a gas at room temperature and atmospheric pressure. Being implanted into crystalline silicon, however, the argon clusters are faceted by low-index planes of silicon. The crystal solid state of the argon here at room temperature means, that the distorted silicon lattice makes a pressure that is high enough to solidify the gas. As it was determined by Faraci, the argon clusters are under a pressure of 4.4 GPa in the silicon lattice. A number of gases are found in form of solid crystallites being implanted in crystalline targets (Kr in Be, Ar in Ni, Kr in Si, Xe in Al, etc., see G. Faraci, A. R. Pennisi, J.-L. Hazemann "XANES of high-pressure Kr clusters in Be and Si" Phys. Rev. B, vol. 56, pp. 12553–12559, 1997).

The as-implanted silicon crystal 300 FIG. 3 with the argon crystalline clusters 301 FIG. 3A inside does not uptake and catch hydrogen. This is not thermodynamically advantageous for this crystalline system. Argon clusters now use the vacancy complexes in silicon, and the complexes do not provide a tensile stress at the half range plane. The argon crystallites do not dissolve hydrogen. A silicon-argon interfaces at boundaries of the argon crystallites contains silicon broken bonds, that still seems to be in a state preventing their passivation by hydrogen.

If the silicon crystal is heated up to some temperature above the temperature during implantation, the argon crystallites melts, or gasify 302 FIG. 3B. For example, argon in silicon melts at 80° C. as it was determined by Faraci. Further heating increases pressure inside of the bubbles, and at some temperature the pressure exceeds ability of the silicon lattice to keep the bubble without plastic deformations around the bubbles. Tips at the edges of the bubbles are created at this point, that happen at temperatures 300° C. or higher 303 FIG. 3C. The tip is a point that is equal to $VH_4$ in a sense, that hydrogen platelets grow from the tip the same way they grow from the platelet nuclei. The wafer is now ready for hydrogenation in a platelet-growing mode (i.e. at temperature over 250° C.) making the platelet layer 304 FIG. 3D. Under further heating the argon begins outdiffusing, and at temperature over about 800° C. the former argon implanted wafer is now a wafer containing a plane of empty voids 305 FIG. 3E. The wafers annealed at this temperature do not accept hydrogen well. Probably, the tips disappear. Also, the wafer surface typically develops increased roughness FIG. 3.E, that is undesirable at next wafer bonding process step. Therefore, the annealing temperature for hydrogenation of the wafers with type (2) implants should be chosen in a range of 200 to 700° C.

Hydrogen can be also used as the type (2) implant. However, the final SOI wafers obtained with this process will be quite similar to the wafers obtained with conventional Smart-cut, i.e. they will have a thick cap. The dose for hydrogen should be chosen about $5 \times 10^{15}$ $cm^{-2}$, because the light hydrogen makes fewer displacements than the heavier ions. Using of hydrogen as a type (2) implant in the fragilization process due to the present invention still has an advantage, that the process does not have a limit on a dose rate of implantation, that is the main shortcoming of the Smart Cut. Also, the fragilization process due to the present invention with hydrogen as a type (2) implant can be used to for making thick cap SOI, that are used as starting substrates in power electronics, and in MEMS. For this case, energy of the implantation is chosen at 300 keV or higher.

The hydrogen can be implanted in forms of protium or deuterium ($H^+$, $H_2^+$, $D^+$, or $D_2^+$). The same final SOI wafer can be obtained with either $H^+$, or with $H_2^+$ implantation, with a proper adjustment for dose and energy. An ion containing more than one atom divides into single nuclei ions or atoms as soon as it hits the target. An initial energy divides between the parts, and implantation of $H_2^+$ at some dose and energy is equal to implantation of $H^+$ with twice higher dose and twice lower energy. The deuterium case is different. The deuterium clusterize differently than protium in lattices. When the implanted specie begins to drift from the ion range plane to the half ion range plane, it meets point lattice defects (divacancies, vacancy-oxygen pairs, etc.) where it gets trapped. The binding energy is typically ~1 eV, that is several times smaller, than binding energy when the hydrogen (either protium or deuterium) get trapped onto hydrogen platelet nuclei. The point defect trapped position is not very stable. Protium detraps from this step, and continues moving toward the half range plane, while deuterium do not detrap, and stay at the point defect site. A mechanism, why the protium and deuterium shows different stability having the same binding energy with the trap is similar to what was described by Kiziliali at al. (Hess, I. C. Kizilyalli, J. W. Lyding, "Giant isotope effect in hot electron degradation of metal oxide silicon devices", IEEE Transactions on Electron Devices, pp. 406–416 Vol. 45, 1998). Namely, the protium has longer lifetime of excited state than deuterium. Being weakly trapped, protium get an energy from a phonon, and keep the phonon's energy staying in an excited state. When the still excited protium catch another phonon, its energy allows protium to detrap and move further to be finally trapped on a deeper trap (for example, hydrogen platelet). Deuterium, when it absorbs a phonon, quickly generates another phonon, and moves back to an unexcited state before next phonon comes. Therefore deuterium has low probability to collect energy by catching several phonons, and deuterium has low probability to leave the trap.

The deurerium implanted substrates show layer transfer with faults and with more rough as-cleaved surface, than the protium implanted substrates. Therefore, deuterium is not recommended for use in the present invention. This is similar to what happen in Smart-Cut if the deuterium is used. The minimum dose of deuterium implant that provides faultless layer transfer is about one order of magnitude higher, than the protium dose needed ($4 \times 10^{17}$ $cm^{-2}$ and $4 \times 10^{16}$ $cm^{-2}$ respectively, A. Y. Usenko, W. N. Carr, B. Chen, "Crystal Fracture Induced By Decorating Of Post-Implantation Defects: Silicon Layer Delaminating", in: Proceedings of 14th International Conference on Ion Implantation Technology, Sep. 22–27, 2002, Taos, N. Mex.). In the Smart-Cut, deuterium distributes in a wide band between deuterium range plane and deuterium half range plane, and does not form a single well defined cleavage plane as protium hydrogen.

The annealed wafer FIG. 3C with a buried layer of gaseous bubbles 303 goes for hydrogenation in plasma at wafer temperature 250 to 400° C. during at least 20 minutes and other conditions as it described in the first preferred embodiment. After the hydrogenation a wafer FIG. 3D contains a fragile layer 304 is ready for the rest of the layer transfer process. On the diagram 201 FIG. 2, the process step 205 is for forming the buried layer of gaseous bubbles, and step 207 is for growing of hydrogen platelets.

Figure 4:
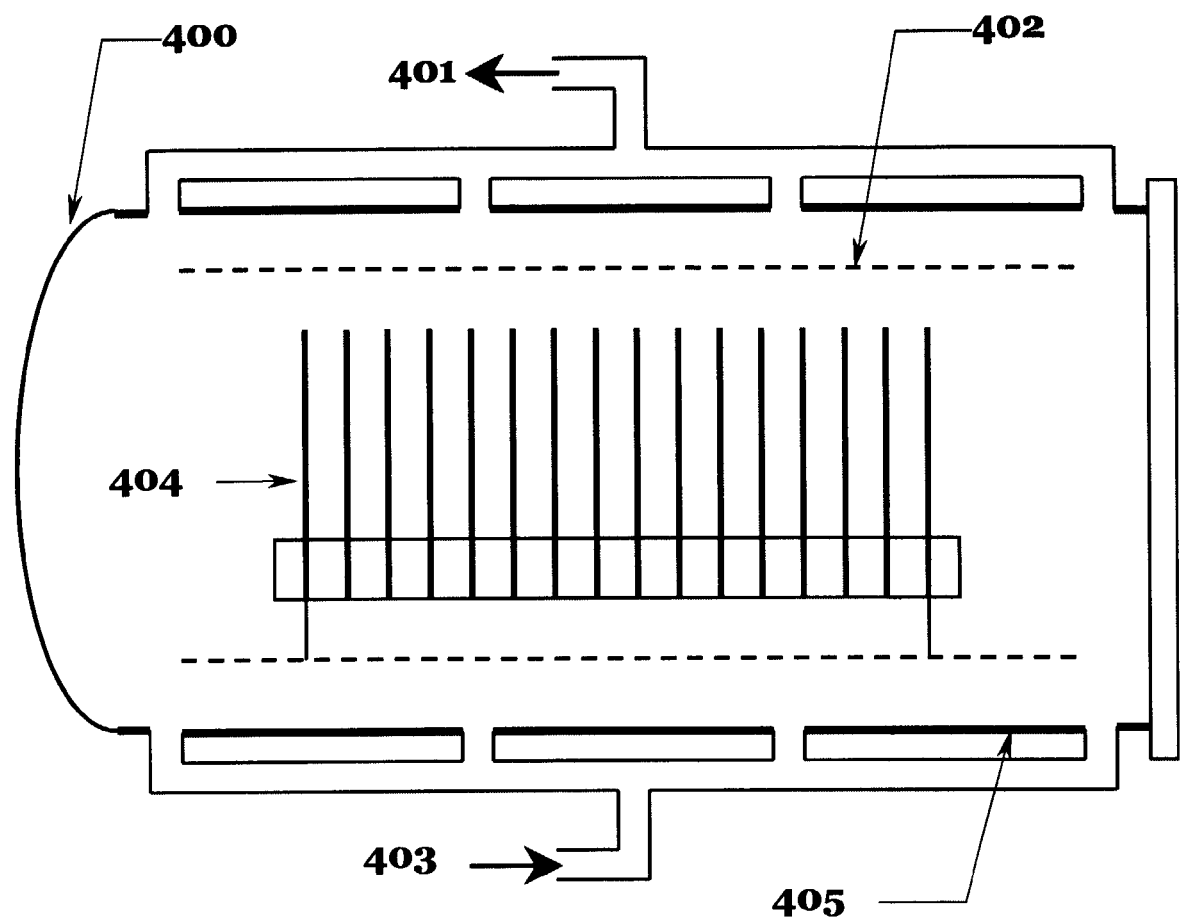
FIG. 4 depicts a cross section of plasma chamber for wafer hydrogenation for batch processing.

Batch plasma processing instead of the single wafer processing can be used to form the fragile layer due to the inventive process. For this case, the wafers 404 on FIG. 4 after a step 202 of process 200 or step 205 of process 201 on FIG. 2 are loaded into a batch plasma chamber 400 having a tunnel 402 for a wafer boat 404, connected to hydrogen source through pipe 403, connected to vacuum pump through pipe 401, and connected to a radio frequency generator through electrodes 405. The chamber 400 has also a proper heater, preferably an infrared heater. The wafers are processed at the same temperature and time ranges as it is explained above for the plasma hydrogenation with single wafer plasma reactor. The plasma conditions can be chosen by one skilled in the art to maximize concentration of atomic hydrogen by varying radio frequency power, incoming gas rate, and other conditions as it is described, for example, in a book "Plasma Etching" edited by D. M. Manos, and D. L. Flamm, Academic Press, Boston, 1989. Other plasma sources, as electron cyclotron plasma (Electron Cyclotron Resonance Ion Sources and ECR Plasmas by R. Geller, Inst. of Physics Publishers 1996, 484 pages), direct current plasma, microwave plasma can be used as well. One skilled in the art can properly choose the plasma equipment for the hydrogenation.

It is to be understood that the above-described embodiments are merely illustrative of the invention and that many variations may be devised by those skilled in the art without departing from the scope of the invention and from the principles disclosed herein. It is therefore intended that such variations be included within the scope of the following claims and their equivalents.

I claim:

1. A method wherein a fragile layer is formed within a first substrate, wherein the improvement comprises forming said fragile layer via at least two processing operations, including:
   (a) a first processing operation, wherein said first processing operation is conducted at a first temperature that falls within a first range of temperatures; and
   (b) a second processing operation, wherein said second processing operation is conducted at a second temperature that falls within a second range of temperatures,
wherein said first range of temperatures is different than said second range of temperatures.

2. The method of claim 1 wherein said first processing operation comprises nucleating platelets.

3. The method of claim 2 wherein said first processing operation further comprises:
   (i) forming hydrogen plasma; and
   (ii) exposing said first substrate to said hydrogen plasma.

4. The method of claim 3 wherein said first range of temperatures includes temperatures that do not exceed 250° C.

5. The method of claim 3 wherein a maximum temperature of said first range of temperatures is less than a maximum temperature of said second range of temperatures.

6. The method of claim 1 wherein said first processing operation further comprises:
   (i) implanting impurities in said first substrate, wherein said impurities do not chemically interact with said first substrate; and
   (ii) gasifying said impurities, thereby forming bubbles within said substrate.

7. The method of claim 6 wherein sub-operation (ii) further comprises forming plastic deformations around said bubbles.

8. The method of claim 6 wherein sub-operation (i) occurs at about room temperature and sub-operation (ii) occurs at said first temperature, and wherein said first range of temperatures includes temperatures that are at least about 300° C. and no more than about 700° C.

9. The method of claim 6 wherein said first processing operation occurs at said first temperature, and wherein said first range of temperatures includes temperatures that are at least about 300° C. and no more than about 700° C.

10. The method of claim 6 wherein said impurities are selected from the group consisting of hydrogen, helium, neon, argon, krypton, and xenon.

11. The method of claim 6 wherein a maximum temperature of said first range of temperatures is greater than a maximum temperature of said second range of temperatures.

12. The method of claim 1 wherein said second processing operation comprises growing platelets.

13. The method of claim 12 wherein said second range of temperatures includes temperatures that are at least 250° C. and no more than 400° C.

14. The method of claim 1 further comprising forming a vacancy cluster-enriched layer within said first substrate and proximal to a first surface of said first substrate, wherein said fragile layer is formed at said vacancy cluster-enriched layer by performing said first processing operation and said second processing operation.

15. The method of claim 14 wherein said vacancy cluster-enriched layer is formed by implanting ions within said first substrate.

16. The method of claim 15 wherein said ion are selected from the group consisting of silicon and germanium.

17. The method of claim 14 wherein said method is for forming a SOI wafer, wherein said method further comprises:
   providing a second substrate, wherein said second substrate comprises a dielectric layer, and wherein said dielectric layer is disposed on a major surface of said substrate;
   forming a wafer assembly by temporarily coupling said second substrate, at said dielectric layer, to said first surface of said first substrate; and
   cleaving said wafer assembly at said fragile layer, wherein, as a result of said cleaving, a portion of said first wafer remains attached to and overlies said dielectric layer, thereby forming said SOI wafer.

18. A method comprising:
   forming a vacancy cluster-enriched layer within a substrate;
   forming nuclei of hydrogen platelets at said vacancy cluster-enriched layer,
wherein said nuclei are formed at a first temperature within a first range of temperatures; and
   growing said hydrogen platelets from said nuclei, wherein growing is performed at a second temperature within a second range of temperatures, wherein said second range of temperatures has a minimum temperature of about 250° C. and a maximum temperature of about 400° C., wherein said first range of temperatures has a different minimum temperature and a different maximum temperature than said second range of temperatures.

19. A method comprising forming a fragile layer in a substrate, wherein:
   (a) said fragile layer is formed via a first sub-operation and a second sub-operation;
   (b) said first sub-operation is carried out at a first temperature that falls within a first range of temperatures;
   (c) said second sub-operation is carried out at a second temperature that falls with a second range of temperatures, wherein said second range of temperatures is between 250° C. and about 400° C.;
   (d) said first range of temperatures is different than said second range of temperatures; and
   (e) said second sub-operation comprises plasma hydrogenation.

* * * * *